(12) United States Patent
Minervini

(10) Patent No.: US 8,816,492 B1
(45) Date of Patent: Aug. 26, 2014

(54) METHOD AND APPARATUS FOR ISOLATING MEMS DEVICES FROM EXTERNAL STIMULI

(71) Applicant: Anthony D. Minervini, Palos Hills, IL (US)

(72) Inventor: Anthony D. Minervini, Palos Hills, IL (US)

(73) Assignee: Qualtre, Inc., Marlborough, MA (US)

( * ) Notice: Subject to any disclaimer, the term of this patent is extended or adjusted under 35 U.S.C. 154(b) by 0 days.

(21) Appl. No.: 13/836,848

(22) Filed: Mar. 15, 2013

Related U.S. Application Data

(60) Provisional application No. 61/779,770, filed on Mar. 13, 2013.

(51) Int. Cl.
*H01L 23/12* (2006.01)
*H01L 23/053* (2006.01)
*B81B 3/00* (2006.01)
*B81C 1/00* (2006.01)

(52) U.S. Cl.
CPC ............ *B81B 3/0021* (2013.01); *B81C 1/00261* (2013.01)
USPC .......................................... 257/701; 257/787

(58) Field of Classification Search
CPC ...... B81B 7/0058; H04R 19/00; H04R 31/00; H04R 1/00
USPC ................................................ 257/701, 787
See application file for complete search history.

(56) References Cited

U.S. PATENT DOCUMENTS

| | | | | |
|---|---|---|---|---|
| 7,298,014 | B2 * | 11/2007 | Diaz | 257/414 |
| 8,126,166 | B2 * | 2/2012 | Song | 381/174 |
| 8,546,170 | B2 * | 10/2013 | Traynor et al. | 438/52 |
| 2006/0118943 | A1 * | 6/2006 | Diaz | 257/701 |
| 2007/0057602 | A1 * | 3/2007 | Song | 310/328 |
| 2008/0046080 | A1 * | 2/2008 | Vanden Bulcke et al. | 623/10 |
| 2012/0267241 | A1 * | 10/2012 | Fredenberg et al. | 204/267 |
| 2012/0305390 | A1 * | 12/2012 | Fredenberg et al. | 204/290.03 |
| 2013/0117980 | A1 * | 5/2013 | Kwon et al. | 29/25.35 |

OTHER PUBLICATIONS

Yu et al. "Laser dynamic forming of functional materials laminated composites on patterned three-dimensional surfaces with applications on flexible microelectromechanical systems", 2009 American Institute of Physics vol. 95, pp. 1-3.*

* cited by examiner

*Primary Examiner* — Telly Green
(74) *Attorney, Agent, or Firm* — Burns & Levinson LLP; Bruce D. Jobse, Esq.

(57) ABSTRACT

An isolation mechanism and technique for packaging a MEMS transducer, such as a bulk acoustic wave gyroscope or accelerometer, which allows rotational information to be sensed by the transducer while providing the necessary isolation from externally applied (or internally induced) stress, strain, vibration, shock and thermal transients. The isolation mechanism is constructed of interposing materials that may be implemented with elastomeric-strain-absorbing-materials (ESAM) layers having different elastic moduli, with the most compliant ESAM layer disposed closest to the MEMS transduce. In another embodiment, one or more ESAM layers may have air pockets dispersed therein. The isolation mechanism enables mechanical, thermal and vibrational isolation of the MEMS transducer from the package substrate, while still permitting electrical continuity between the MEMS device and the external environment.

11 Claims, 10 Drawing Sheets

METHOD AND APPARATUS FOR ISOLATING MEMS DEVICES FROM EXTERNAL STIMULI

FIELD OF THE INVENTION

The disclosure relates to Microelectromechanical Systems (MEMS) devices, and, more specifically, to an apparatus and technique for isolating MEMS devices from external and internal stimuli.

BACKGROUND OF THE DISCLOSURE

Microelectromechanical Systems (MEMS) devices are typically attached to a housing structure, and the housing structure attached to another entity, such as a circuit board. External forces transmitted from the housing structure to the MEMS device may detrimentally affect the performance of the MEMS sensor or transducer located within the MEMS device. For example, if the sensor 30 comprises a bulk acoustic wave resonator having a disc shaped resonator element, such as disclosed in United States Patent Application Publication 2012/0227,487, the transducer may be supported at the disc center by an anchor. For other devices utilizing a capacitive resonator element, such as those disclosed in U.S. Pat. No. 7,023,065, an anchor may still support the transducer symmetrically so as not to bias the performance of the transducer due to its location.

While certain prior publications address how to protect MEMS devices with sensing gaps on the order of micrometers, they have not disclosed how to protect MEMS devices wherein the sensing gaps are on the order of nanometers. The susceptibility to interfering stimuli for devices based on nanometer distances for the sense gaps is perhaps 100 to 1000 times greater than those based on micrometer distances.

Devices with nanometer sized gaps are ~100-1000 times more susceptible to induced strains caused by stresses, vibrations, thermal fluctuations than those with micrometer sized gaps. This is due to the fact that the minute fluctuations in gap distance caused by the stresses, vibrations and thermal transients are much larger fraction of the gap on a nanometer gapped device than a micrometer gapped device. This stems from the physics of how capacitance is defined. The change in gap causes a change in capacitance which causes a change in the output signal. When this gap distance is affected by stimuli other than the desired signal source, it is perceived as "noise" and is consequently undesirable.

There have been many disclosures relating to MEMS gyroscopes being fabricated on silicon die. While these disclosures have generally disclosed how to protect MEMS devices wherein the sensing gaps are on the order of micrometers; they have not disclosed how to protect MEMS devices wherein the sensing gaps are on the order of nanometers. The susceptibility to interfering stimuli for devices based on nanometer distances for the sense gaps is perhaps 100 to 1000 times greater than those based on micrometer distances. Some practices, in the past have involved using compliant adhesives, flexible substrates and mechanical flexures to address the issue of susceptibility. Devices with Nanometer sized gaps are ~100-1000 times more susceptible to induced strains caused by stresses, vibrations, thermal fluctuations than those with micrometer sized gaps. This is due to the fact that the minute fluctuations in gap distance caused by the stresses, vibrations and thermal transients are much larger fraction of the gap on a nanometer gapped device than a micrometer gapped device. This stems from the physics of how capacitance is defined. The change in gap causes a change in capacitance which causes a change in the output signal. When this gap distance is affected by stimuli other than the desired signal source, it is perceived as "noise" and is consequently undesirable.

Accordingly, a need exists for a mechanism that isolates the transducer within a MEMS device from both internal and external stimuli.

SUMMARY OF THE DISCLOSURE

Disclosed is an isolation mechanism and technique for packaging a MEMS devices, such as a bulk acoustic wave gyroscope or accelerometer which allows rotational information to be sensed by the sensor while providing the necessary isolation from externally applied (or internally induced) stress, strain, vibration, shock and thermal transients. The MEMS device may comprise a housing substrate, one or more transducers, one or more integrated circuits, and an isolation mechanism constructed of interposing materials that permit mechanical, thermal and vibrational isolation of the transducer from the substrate, while still permitting electrical continuity between the MEMS device and the external environment. The interposing materials provide isolation from interfering stimuli, and, in conjunction with their physical proximity to the transducer and a substrate within an aperture/cavity of the MEMS device housing, effectively decrease the mechanical coupling between the transducer, the substrate and subsequent stimuli from both the external and internal environment, all while still permitting electrical continuity to be maintained between the transducer and substrate. The advantages of the disclosed system and techniques over the existing art is an increased isolation from both external stimuli as well as internally generated stimuli that are not desirable and thus considered noise.

According to one aspect of the disclosure, a microelectromechanical (MEMS) apparatus comprises: a MEMS transducer having plurality of exterior surfaces; and a compliant isolation mechanism surrounding the plurality of exterior surfaces. In one embodiment, the isolation mechanism comprises a plurality of elastomeric-strain-absorbing-material layers having different elastic moduli. In another embodiment, the most compliant of the plurality of elastomeric-strain-absorbing-materials layers is disposed adjacent the MEMS transducer. In another embodiment, a plurality of elastomeric-strain-absorbing-materials are disposed adjacent one another and arranged in progressive order of their respective the elastics moduli values relative to the MEMS transducer.

According to another aspect of the disclosure, a method of manufacturing a microelectromechanical (MEMS) device comprises: providing a MEMS transducer having a plurality of exterior surfaces; and B) applying an isolation layer of elastomeric-strain-absorbing-material (ESAM) adjacent plurality of exterior surfaces of the MEMS transducer.

According to still another aspect of the disclosure, A microelectromechanical (MEMS) package apparatus comprises: a MEMS transducer having plurality of exterior surfaces and defining one or more electrical contact areas; a plurality of electrical conductors connected to the electrical contact areas; and an isolation layer surrounding the plurality of exterior surfaces and at least partially surrounding the plurality of electrical conductors.

DESCRIPTION THE DRAWINGS

Embodiments of the disclosed subject matter are described in detail below with reference to the following drawings in which.

DETAILED DESCRIPTION

Figure 1A:
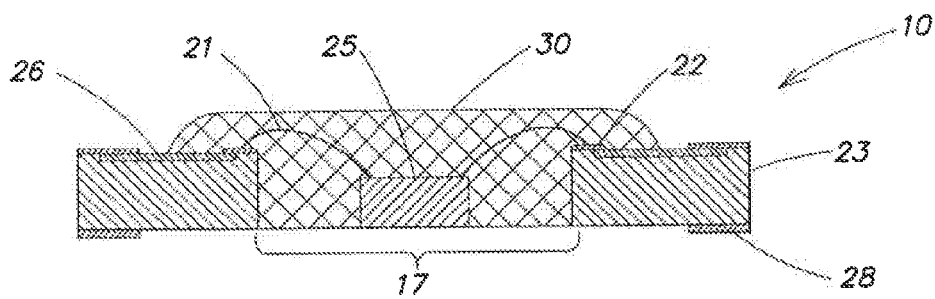
FIG. 1A illustrates conceptually a cross-sectional view of a MEMS device in accordance with an embodiment of the present disclosure.

MEMS devices, in particular capacitive devices like gyroscopes, accelerometers, microphones, pressure sensors and combinations thereof, are susceptible to having their performance compromised by externally induced strains. This is due, in part, because there are typically very small air gaps, on the order of 100's of nanometers in BAW devices, and micrometers in other devices, that will change when then the structures defining them are moved with respect to each other. The external strains may be introduced by a number of methods. One for example is the thermal mismatch between the device and the board to which it is mounted and also the solder or adhesive used to achieve such attachment. Such mismatch results in a warpage of the MEMS package, and, hence, an induced strain in all bodies in the system. Another source of strain is that which is incurred during the assembly of the MEMS device. In this scenario, the MEMS sensor, and the surrounding housing/package, along with adhesives, have differing thermal expansion coefficients and as well as different Young's Moduli. Combining these objects together, using traditional assembly processes requiring heating steps, results in residual stresses in the composite structure which then results in strains in the bodies of that composite structure. If there is a MEMS sensor in the composite structure, it too will be subjected to these stresses and strains.

The isolation mechanism disclosed herein mitigates the stress and strain transfer to the MEMS sensor by virtue of the structure and material selection. By surrounding the MEMS sensor on all sides with a very low modulus material, the transmission of stress and strain to the sensor is mitigated. Additionally, the isolation mechanism provides an enclosure which is isotropic, in that there is no direction which is inherently more susceptible to externally applied stress and strain. This isotropic enclosure is more beneficial with regards to thermally induced stresses and strains as well as isolation from vibration.

Capacitive based, MEMS sensors with sense air gaps on the order of 100's of nanometers, may exhibit high sensitivity to vibrational and acoustic energy. These forms of energy may manifest in the form of noise that compromises the signal fidelity of the MEMS sensor. Additionally, MEMS sensors, whose operation involves the excitation of one member of the device by electrical actuation, also cause vibration will suffer the problem of preventing other portions of the sensor from also vibrating in phase with the member which is excited. When such a sensor is affixed to a substrate or other structure for the purpose of extracting useful operation, the vibrations are controlled so that signal integrity is not compromised, by suspending the MEMS sensor in a way that maximizes isolation of the vibrations, but still allow for robust electrical and mechanical connections to the package, housing or mounting structure.

Capacitive MEMS sensors using very small air gaps (~100 nanometers) may also be affected by small, rapid fluctuations in temperature on account of the small scale. Large, slow variations in temperature can typically be accommodated by electronic correction algorithms, however, smaller rapid fluctuations, akin to Brownian motion may result in an apparent noise signal, which tends to compromise the performance of a BAW type sensor. Coating or covering the sensor with a material, other than air, may attenuate the magnitude and hence effect of the thermal fluctuations at the critical structures of the MEMS sensor, however, without due care in material selection, the mechanical properties, e.g. Young's modulus and coefficient of thermal expansion may induce other strains in the sensor when absorbing the thermal energy. This may result in degradation of device performance similar to that described above whereby stresses, strains and vibrations manifest as noise in the system and thus degrade the Signal to noise (or fidelity) of the device.

External sources of vibration may cause degradation of the device function. Internal vibrations may also be a source of degradation and may also be mitigated through addition of elastomeric masses which are inherently non-linear and thus effectively dissipative with respect to vibrational energy. The vibration of the disc in a bulk acoustic wave MEMS device is complicated by the fact that other structures in the sensor (i.e. electrodes, cap wafer, handle wafer) are also vibrating. In some cases, these structures vibrate in phase with and couple to the disc-shaped resonator resulting in a degradation of the overall sensor performance, with the vibrations manifest as noise and thus compromise the signal-to-noise ratio in the sensor output signal. To mitigate such effect masses, e.g. silicones, elastomers in general, attached to these other structures, e. g. electrodes, cap, and handle wafer, that are non-linear materials. The non-linear materials are known to be effective absorbers of vibrational energy and hence serve to attenuate such unwanted vibrations thereby approaching a more ideal situation where the disc appears to be vibrating in free space and has minimal coupling to any other structures. Quenching unwanted vibrations of the structures which are not the disc, effectively increases the sensitivity of the device which is manifest as an increase in signal to noise ratio (SNR).

Thermal fluctuations are another form of vibrational energy that also result in fluctuations in physical dimensions via the thermal expansion coefficients. By attaching additional elastomeric mass to the exterior of the MEMS sensor, the external thermal fluctuations are attenuated due to the elastomer's heat capacity. Furthermore, when the elastomer heats and cools, it expands and contracts, however, due to its very low elastic modulus (a typical property of an elastomer) and percent elongation, these expansions and contractions are not necessarily transferred to the sensor, which typically comprises silicon or ceramic. The modulus of silicon is many orders of magnitude higher than silicone. The result is that the elastomer provides for attenuation of thermal fluctuations while not impinging any significant stresses or strains to the sensor.

Airborne acoustic vibrations (i.e. sound) may also manifest at the transducer as noise on account of it having excited the exterior of the package or portions of its bulk that are adjacent to the exterior. To remedy this, one or more of the elastomeric materials, typical the outer-most portions may be constituted in such a way to act as an open-cell foam. This has the effect of attenuating acoustic energy impingement upon it resulting in an attenuation of vibrations that would be transmitted to and sensed by the transducer.

Currently, the state of the art in MEMS gyroscope packaging, does not recognize that the vibrating element (disc) of the MEMS transducer not only has to be isolated from the external environmental vibrations but also from the vibrations of the other elements of the MEMS transducer itself. In particular, the supporting portions (bulk of the silicon die) and the electrodes are not supposed to be vibrating in phase with the disc or at all. Moreover, the element referred to as the anchor, which is a very small diameter disc that physically connects the disc to the support element is a source of vibration coupling between the disc and the support. Additional coupling is achieved by virtue of attenuating and dissipating the vibrations of the support on account of the mass of non-linear material (silicone) attached to it. This increased mass and also energy dissipative material, serves to quench the vibrations in the support and as a result the vibrations of the disc can be more effectively sensed.

Figure 1B:
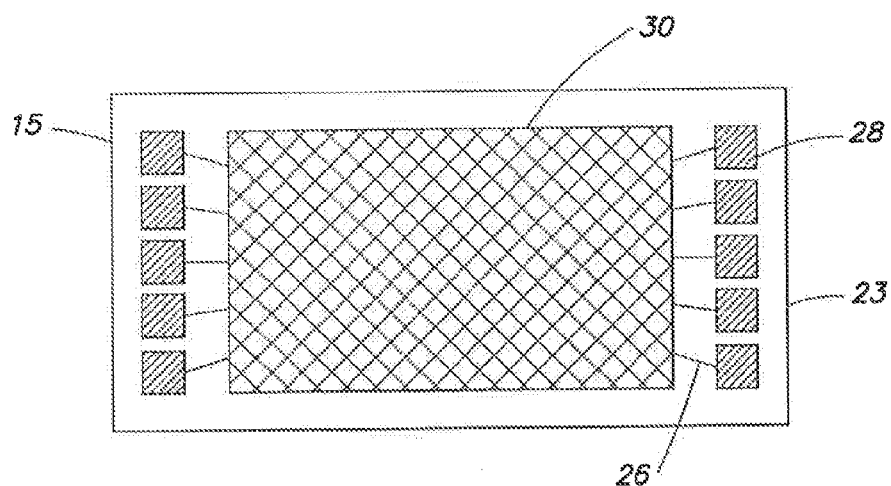
FIG. 1B illustrates conceptually top view of a MEMS device of FIG. 1A in accordance with an embodiment of the present disclosure.
Figure 1C:
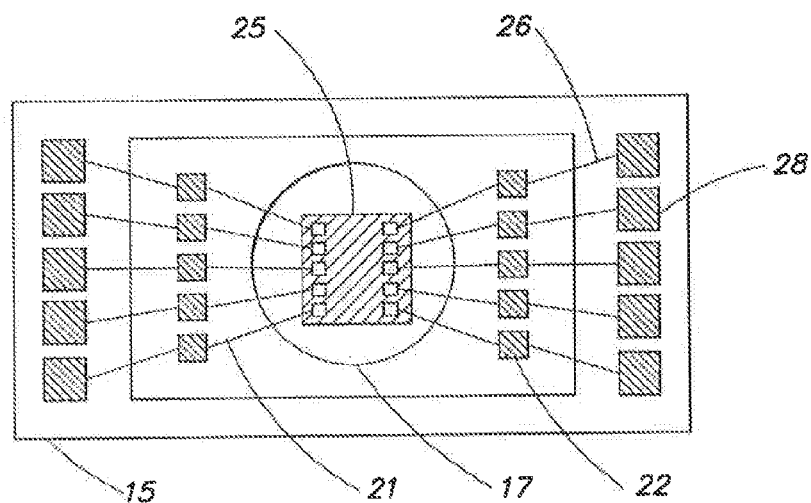
FIG. 1C illustrates conceptually a partial top view of a MEMS device of FIG. 1B in accordance with an embodiment of the present disclosure.

FIGS. 1A-C illustrate conceptually cross sectional side and top views of MEMS device package 10 comprising a substrate 23, MEMS transducer 25, an aperture 17 disposed within the substrate 23, wirebonds 21, solder pads 28, conduits 26 between wirebond pads 22 and solder pads 28 disposed on the surfaces of the substrate 23, and an elastomeric-strain-absorbing-material (ESAM) ESAM#1 30.

Figure 2:
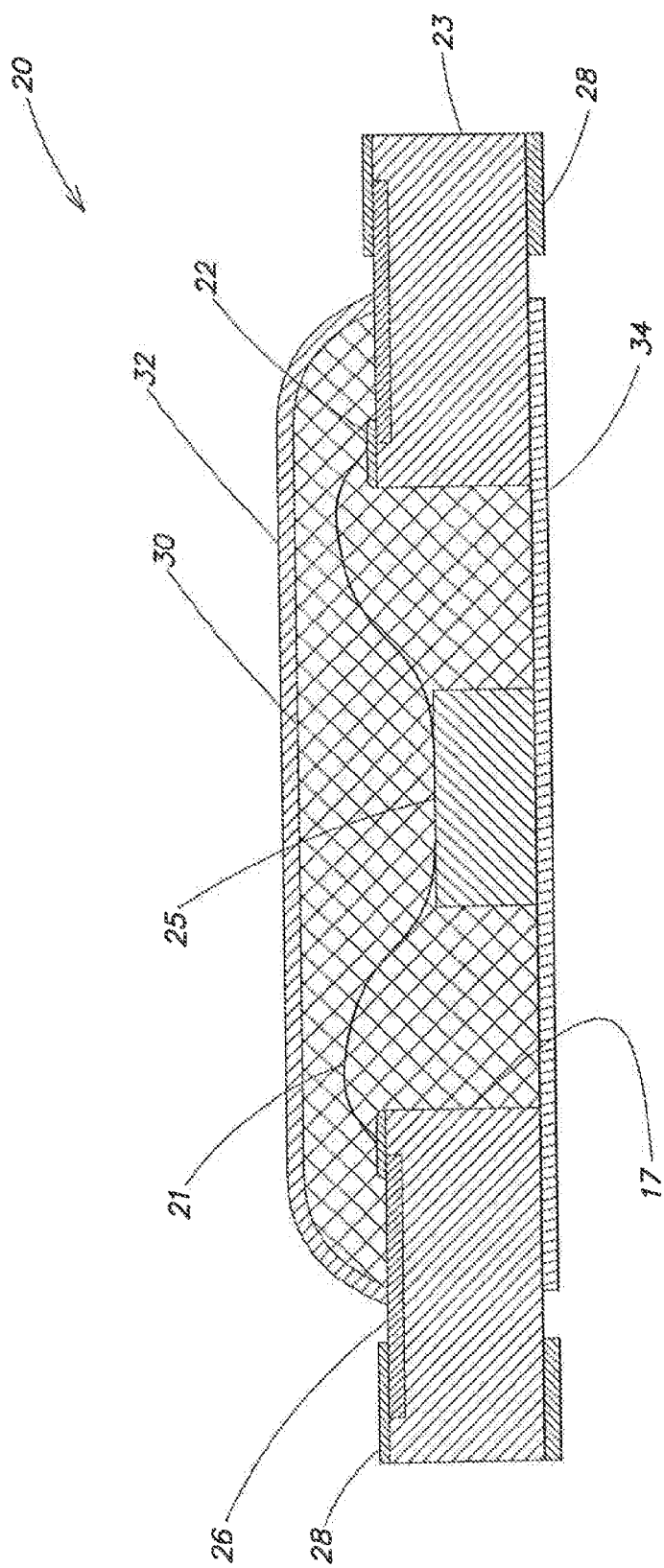
FIG. 2 illustrates conceptually a cross-sectional view of the MEMS device of FIG. 1A with addition ESAM layers in accordance with an embodiment of the present disclosure.

FIG. 2 illustrates a cross sectional side view of MEMS device package 20 comprising a substrate 23, MEMS transducer 25, an aperture 17 disposed within the substrate 23, wirebonds 21, solder pads 28, conduits 26 between wirebond pads 22 and solderpads disposed on the surfaces of the substrate, and a plurality elastomeric-strain-absorbing-materials ESAM#1 30, ESAM#2 32 and ESAM#3 34 disposed on multiple surfaces of the substrate 23 and on one another. The MEMS device package 10 illustrated in FIG. 1A also illustrates a partially constructed MEMS device package 20 of FIG. 2, with the ESAM#2 and ESAM#3 layers not yet applied.

Figure 3:
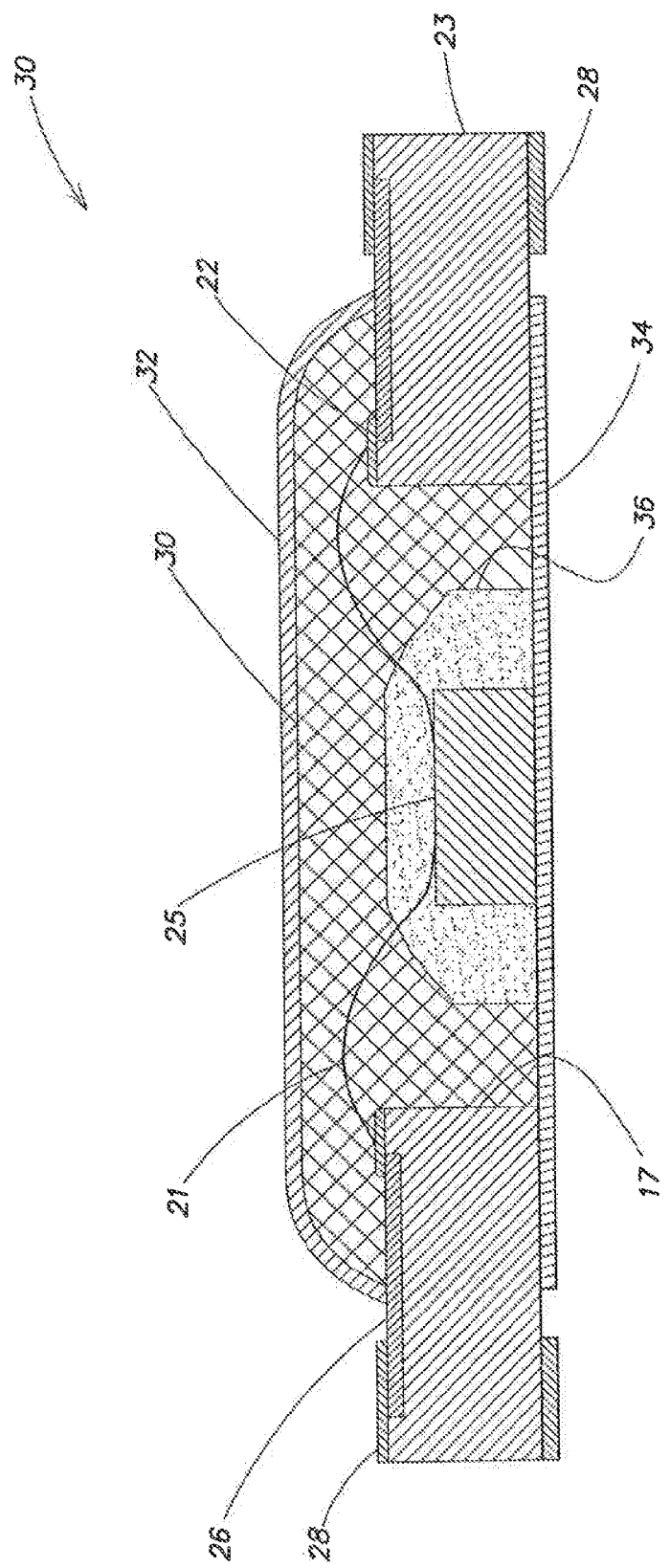
FIG. 3 illustrates conceptually a cross-sectional view of a MEMS device in accordance with another embodiment of the present disclosure.

FIG. 3 illustrates a cross sectional side view of MEMS device package 30 comprising a substrate 23, MEMS transducer 25, an aperture 17 disposed within the substrate 23, wirebonds 21, solder pads 28, conduits 26 between wirebond pads 22 and solderpads disposed on the surfaces of the substrate, and a plurality elastomeric-strain-absorbing-materials ESAM#1 30, ESAM#2 32, ESAM#3 34 and ESAM#3 36 layers disposed on multiple surfaces of the substrate 23 and on one another, with not all ESAM layers being in contact with the substrate 23 or the transducer 25.

Figure 4:
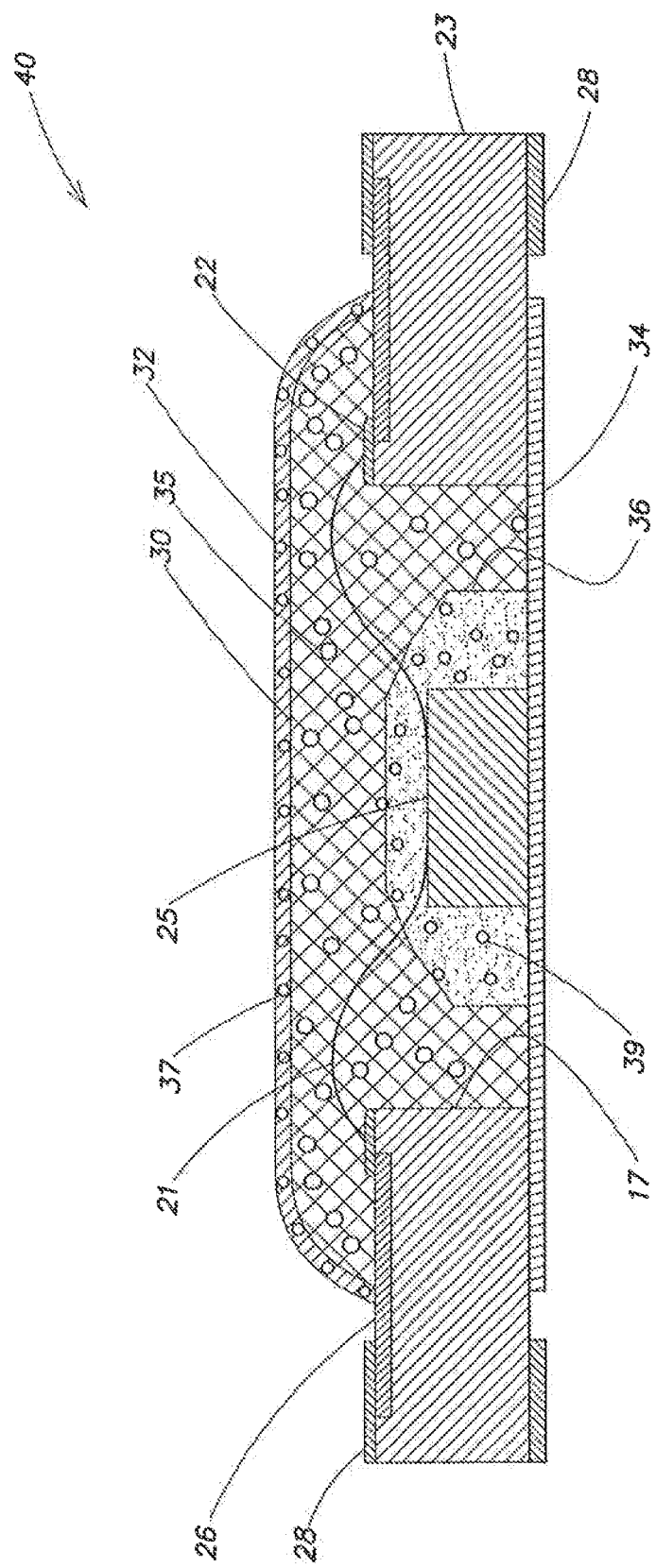
FIG. 4 illustrates conceptually a cross-sectional view of an alternative embodiment of the MEMS device of FIG. 3 with the addition of voids within the ESAM layers in accordance with another embodiment of the present disclosure.

FIG. 4 illustrates a cross sectional side view of MEMS device package 40 comprising a comprising a substrate 23, MEMS transducer 25, an aperture 17 disposed within the substrate 23, wirebonds 21, solder pads 28, conduits 26 between wirebond pads 22 and solderpads disposed on the surfaces of the substrate, and a plurality elastomeric-strain-absorbing-materials ESAM#1 30, ESAM#2 32, ESAM#3 34 and ESAM#4 36 layers disposed on multiple surfaces of the substrate 23 and on one another, with not all ESAM layers being in contact with the substrate 23 or the transducer 25. In addition, one or more of layers ESAM#1 30, ESAM#2 32 and ESAM#4 36 may have disposed within their respective ESAM layer a plurality of voids or air pockets 35, 37, 39, respectively, which may or may not form an interconnected network within the ESAM layer itself or opening the exteriorly of the layer. The voids or air pockets within a respective ESAM layer may be introduced into the ESAM material during the manufacture thereof may be purchased with the voids already disbursed therethrough, or may be introduced within a respective ESAM layer during the process of fabricating the MEMS device package.

Figure 5:
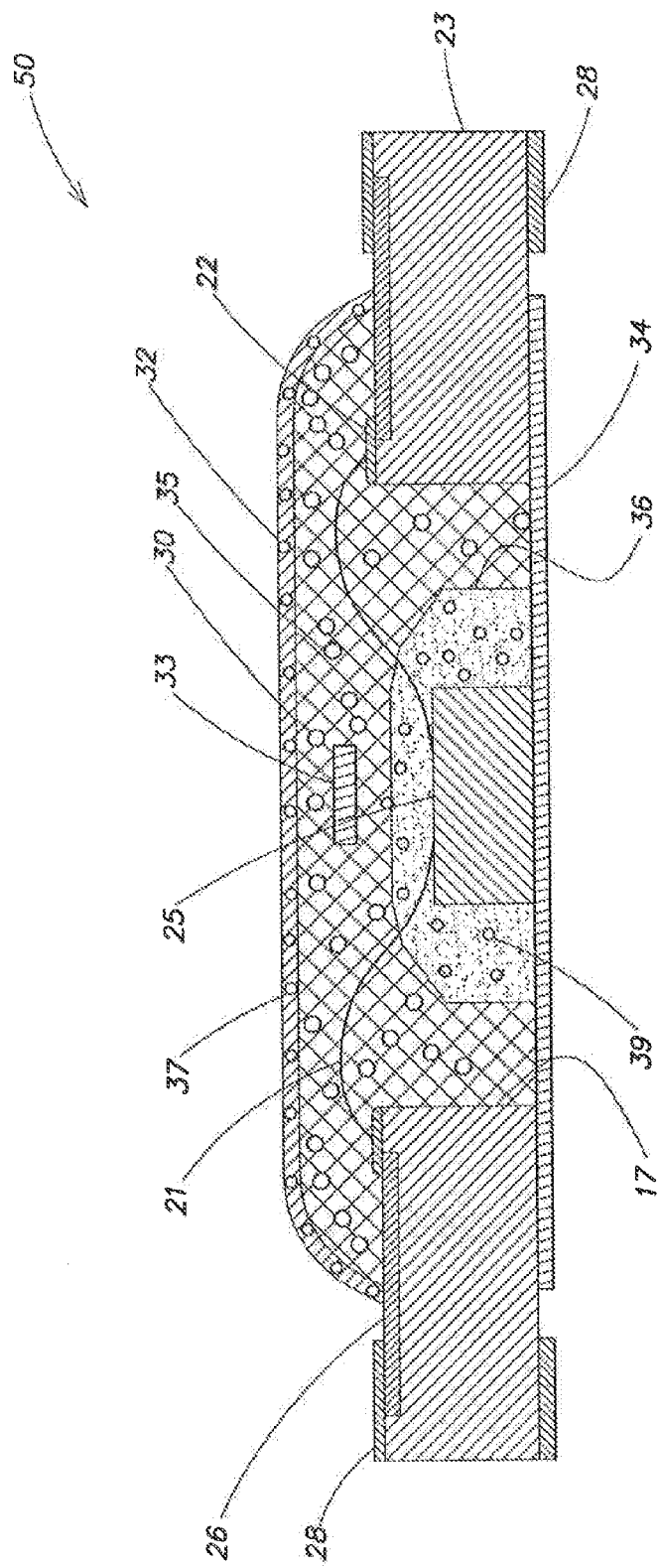
FIG. 5 illustrates conceptually a cross-sectional view of an alternative embodiment of the MEMS device of FIG. 4 with the addition of reciprocating masses within the ESAM layers in accordance with another embodiment of the present disclosure.

FIG. 5 illustrates a cross sectional side view of MEMS device package 50 substantially similar in construction to MEMS device package 40 of FIG. 4 but with the addition of a reciprocating mass (body) 33 suspended in one or more ESAM layers 30, 32, 34, or 36. In the illustrative embodiment, reciprocating mass 33 may be embedded into the ESAM layer at the time of its application and may comprise a substantially hollow cylinder having a mass which moves, typically on track, within the cylinder, or, alternatively, a mass connected to the cylinder body with a deformable spring. Other devices which allow for the absorption anticipation of energy from the surrounding ESAM layer may also be utilized as a reciprocating mass 33.

Figure 6:
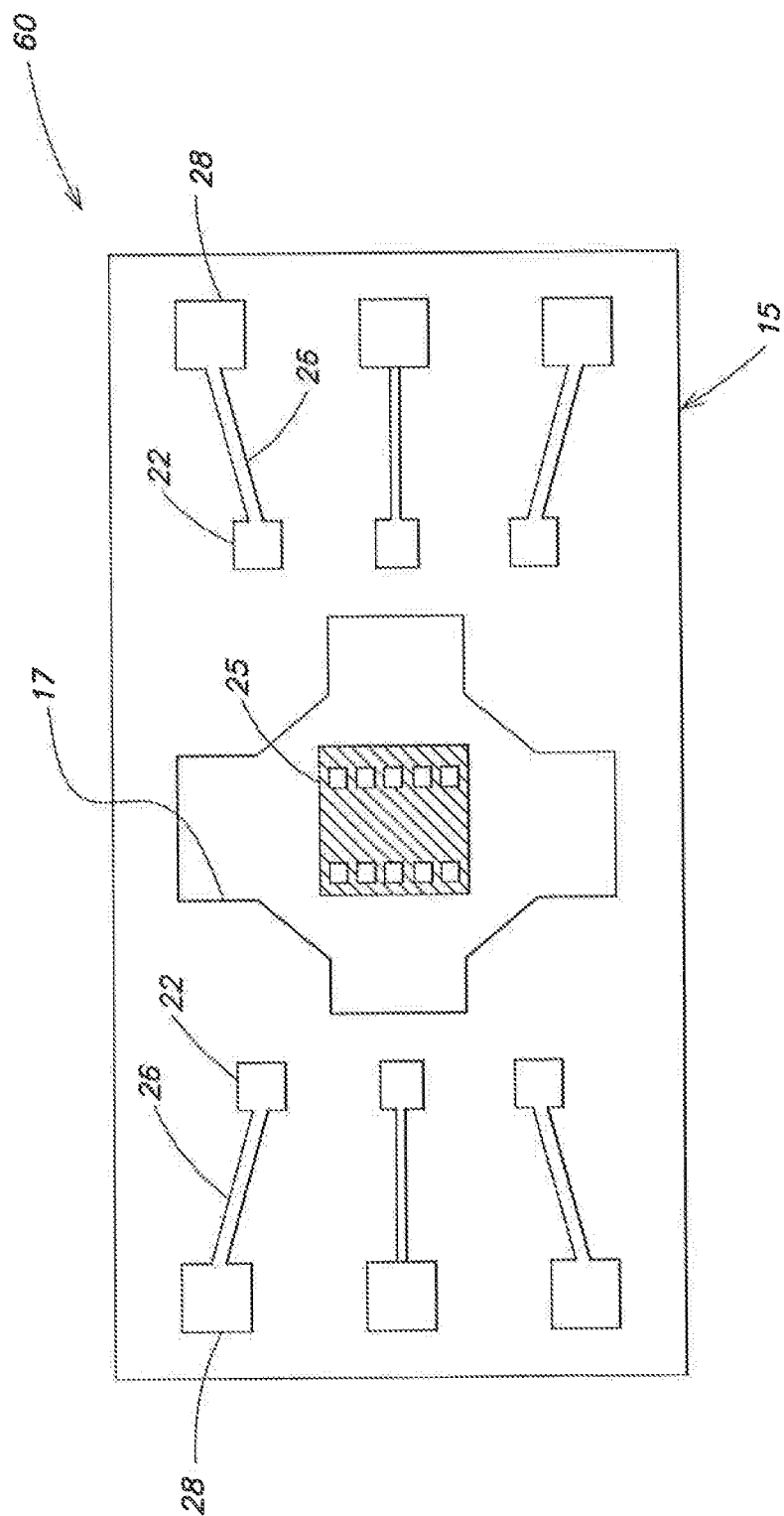
FIG. 6 illustrates conceptually a partial top view of a MEMS device having a base substrate aperture in accordance with another embodiment of the present disclosure.

FIG. 6 illustrates a top view of MEMS device package 60 comprising a substrate 23 and MEMS transducer 25 disposed within a cavity or aperture 17 where the shape of the aperture may be a circle, regular polygon, irregular polygon or other shape, which used with any of the isolation mechanisms described herein will further help isolate MEMS transducer 25 from stimuli both internal and external to the housing 15. Note that conduits 26 provide an electrical conduction path between solder pads 28 and wirebond pads 22.

Figure 7:
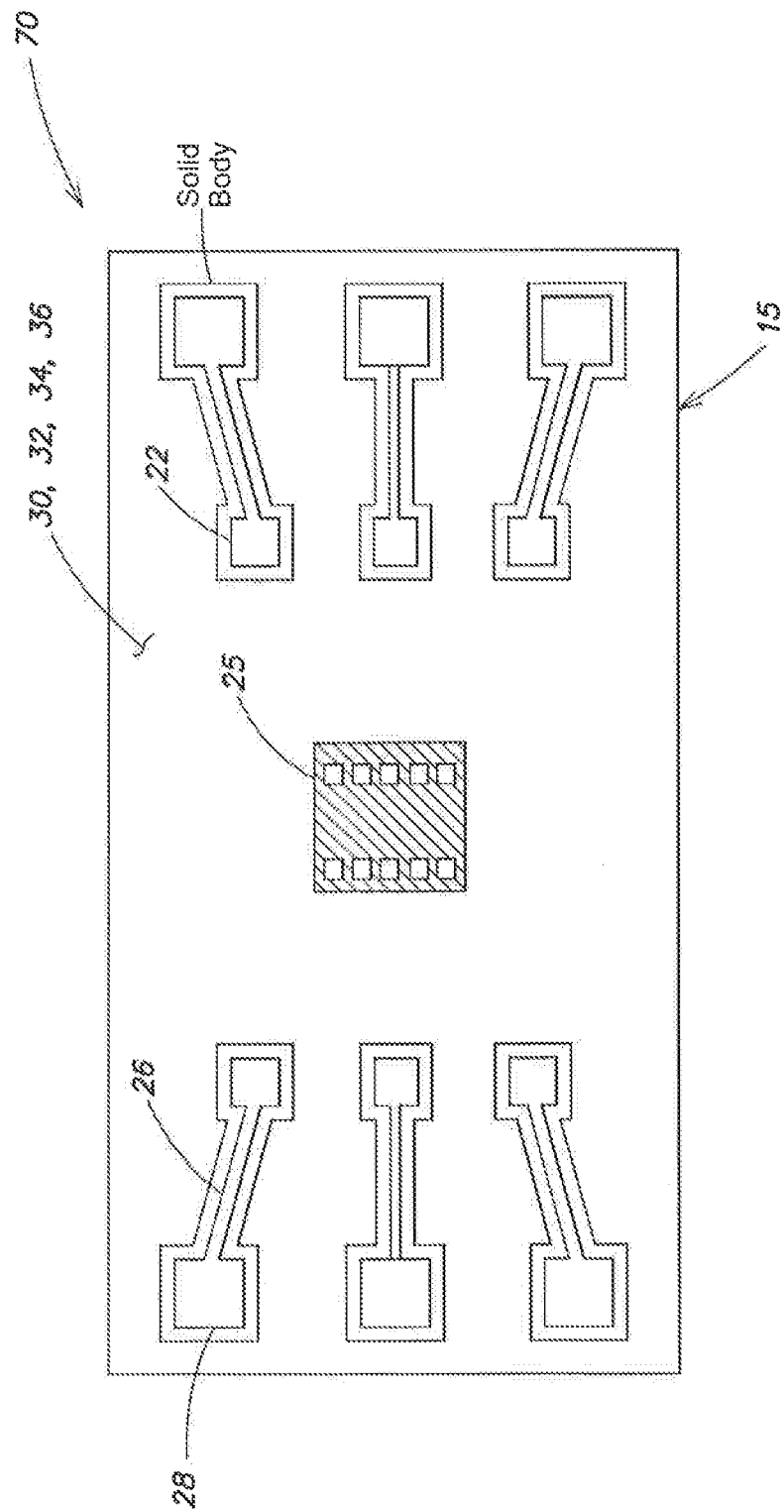
FIG. 7 illustrates conceptually a partial top view of a MEMS device showing the relationship of the electrical connectors to the transducer in accordance with another embodiment of the present disclosure.

FIG. 7 illustrates a top view of MEMS device package 70 comprising multiple elements, each with a wirebond pad 22 and solder pad 28 disposed on a body connecting them, constituting the substrate 23 when considered with other bodies forming the package.

Figure 8:
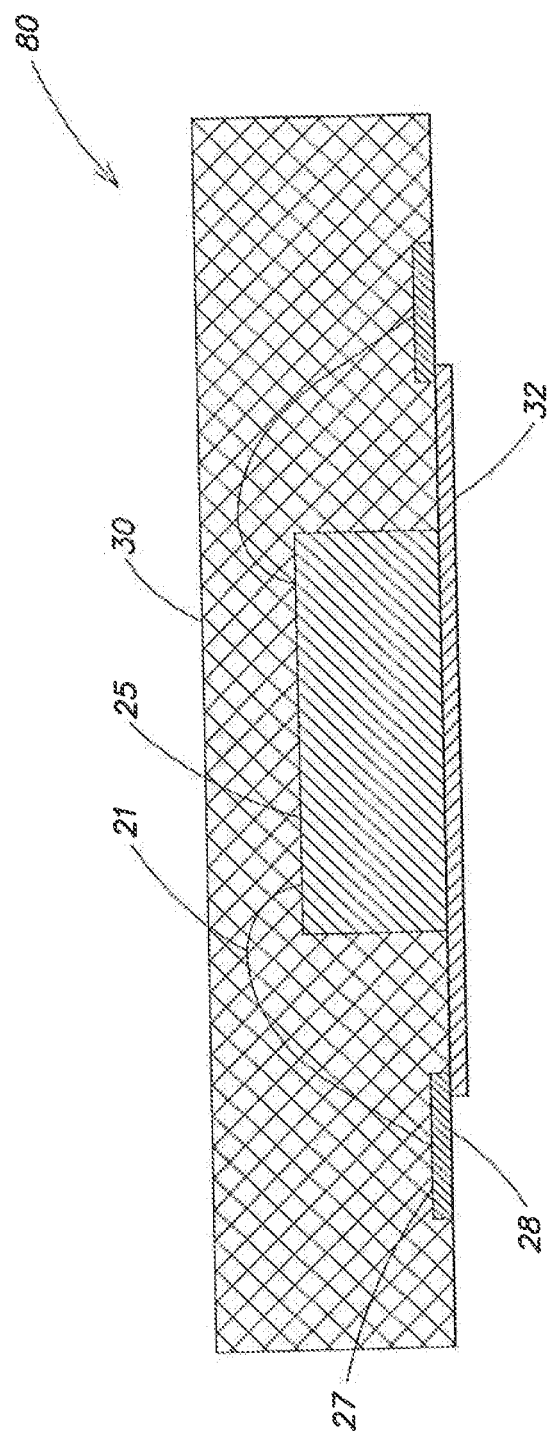
FIG. 8 is illustrates conceptually a cross-sectional view of a MEMS device in accordance with another embodiment of the present disclosure.

FIG. 8 illustrates a cross sectional side view of MEMS device package 80 comprising a substrate is reduced to just the solder pad bodies 28 which also serve as wirebond pads 22 when considered with other bodies forming the package.

Figure 9:
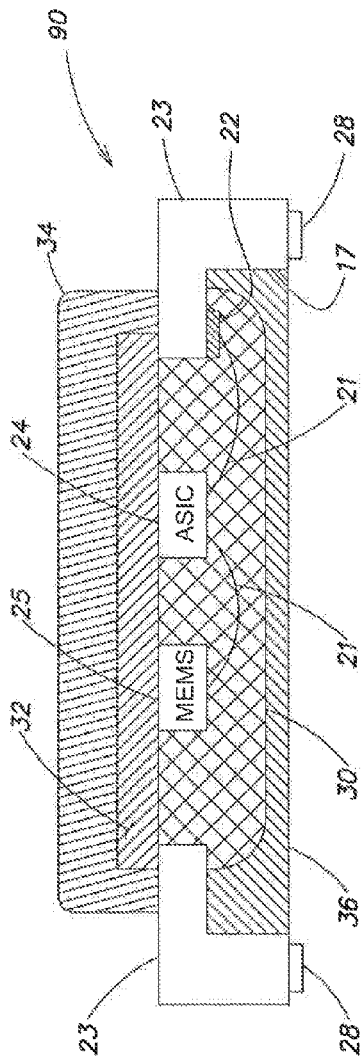
FIG. 9 illustrates conceptually a cross-sectional view of a MEMS device in accordance with another embodiment of the present disclosure.

FIG. 9 illustrates conceptually a cross-sectional view of a MEMS device 90 in accordance with another embodiment of the disclosure comprising a substrate 23, an ASIC semiconductor chip 24 and MEMS transducer 25 disposed an aperture 17 and electrically interconnected by wirebonds similar to wirebonds 21. MEMS device 90 further comprises, wirebond pads 22, solder pads 28, and a plurality elastomeric-strain-absorbing-materials ESAM#1 30, ESAM#2 32, ESAM#3 34 and ESAM#4 36 layers disposed on multiple surfaces of the substrate 23 and on one another, with ESAM#1 30, ESAM#2 32 being in contact with ASIC semiconductor chip 24 and MEMS transducer 25.

Figure 10:
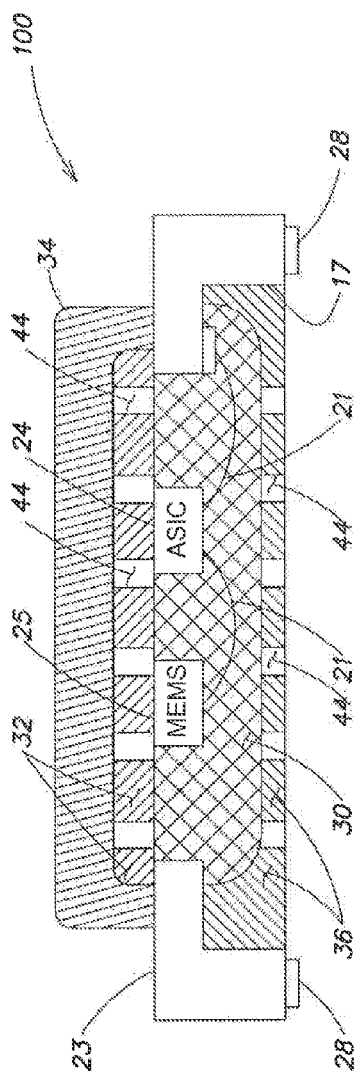
FIG. 10 illustrates conceptually a cross-sectional view of a MEMS device in accordance with another embodiment of the present disclosure.

FIG. 10 illustrates conceptually a cross-sectional view of a MEMS device 100 in accordance with another embodiment of the disclosure. MEMS device 100 is similar in construction to MEMS device 90 with the addition of a plurality of air columnar air pockets 44 disposed within and extending at least partially through their respective ESAM layer, which may or may not form an interconnected network within the ESAM layer itself or opening the exteriorly of the layer. The columnar air pockets 44 may be introduced within a respective ESAM layer during the process of fabricating the MEMS device package, by means of laser cutting, drilling, template stenciling, etc. Such columnar air pockets further help to isolate ASIC semiconductor chip 24 and MEMS transducer 25 from stimuli external or internal to the package housing.

Figure 11:
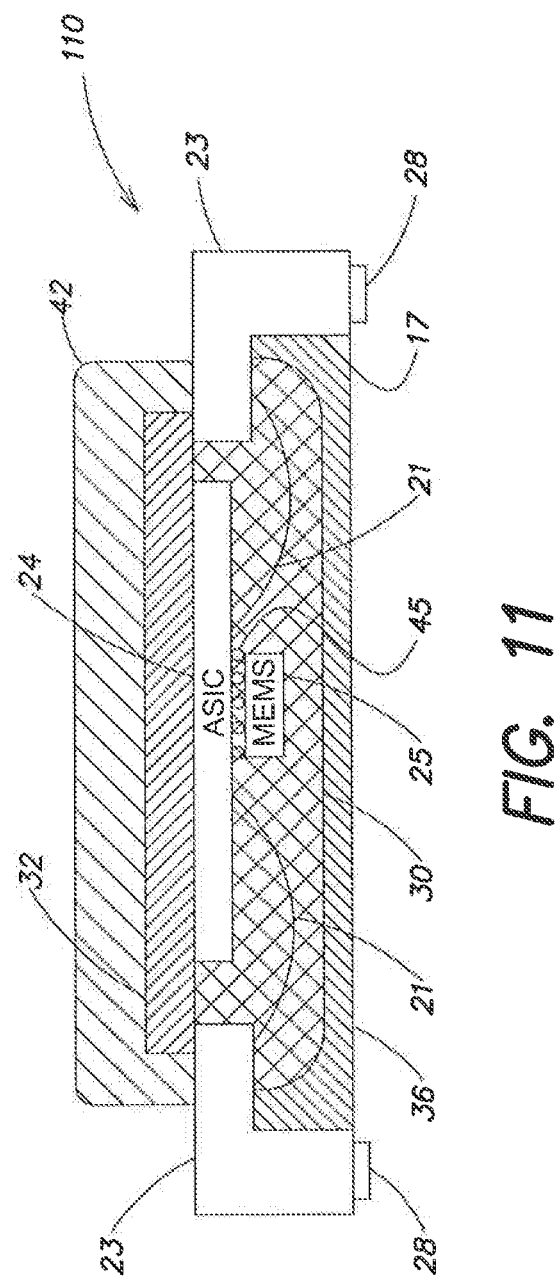
FIG. 11 illustrates conceptually a cross-sectional view of a MEMS device in accordance with another embodiment of the present disclosure.

FIG. 11 illustrates conceptually a cross-sectional view of a MEMS device 110, in accordance with another embodiment of the disclosure, which is similar in construction to MEMS device 90 of FIG. 9, except that electrical connection between ASIC semiconductor chip 24 and MEMS transducer 25 is achieved with gold on gold interconnect interface 45 instead of wirebonds. Open spaces within the gold on gold interface 45 may be filled with a thermally conductive material to assist with dissipation of heat from the interconnected devices. In addition, an exterior most ESAM layer has been replaced with an electromagnetic interference (EMI) shield 42 to further isolate ASIC semiconductor chip 24 and MEMS transducer 25 from EMI interference.

Any of the ESAM layers disclosed herein may be implemented with a nonlinear material. As used herein a "nonlinear material" refers to a material in which some specified influence, such as stress, electric field, or magnetic field, produces a response, such as strain, electric polarization, or magnetization, which is not proportional to the influence. An elastomer is an example of a non linear material. Rubber is an example of an elastomer. Silicone is an example of a rubber. Silicones are a type of rubber and generally considered to be elastomers and hence non-linear materials. Silicones also function as durable dielectric insulation, as barriers against environmental contaminants and as stress-relieving shock and vibration absorbers over a wide temperature and humidity range. Examples of non-linear materials suitable for use as the ESAM layers described herein may be selected from any number of commercially available elastomer products such as Sylgard® 160 Silicone, Sylgard® 164 Silicone, Sylgard® 170 Silicone, Sylgard® 184 Silicone, and Sylgard® 186 Silicone, commercially available from DOW Corning Silicones, Parc Industriel de Seneffe 1, 7180 Seneffe, Belgium. Other similar or different nonlinear materials may likewise be utilized to achieve the same results described herein In those embodiments described herein utilizing multiple ESAM layers or coatings, the respective the elastics (Young's) moduli values do not have to be identical or even within the same general range. More specifically, in embodiments described herein utilizing multiple ESAM layers it is desirable to position the most compliant ESAM layer(s) nearest the MEMS transducer. Even more specifically still, where multiple ESAM layers are disposed adjacent one another, it may be desirable to arrange the ESAM layers in progressive order of their respective the elastics moduli values. For example, in a MEMS device package utilizing three ESAM layers having different respective elastics moduli values and respective distances from the MEMS transducer, the most compliant ESAM layer, that is, ESAM layer having the lowest elastics modulus value, may be disposed nearest or directly adjacent the exterior of the MEMS transducer, with the second most compliant ESAM layer adjacent the most compliant ESAM layer but more distant to the MEMS transducer, and the third or least compliant of the ESAM layers adjacent the second most compliant ESAM layer but even more distant to the MEMS transducer, so that the arrangement of ESAM layers creates a gradient, as measured by the respective elasticity moduli of the ESAM layers, about the MEMS transducer. In other embodiments, the arrangement of ESAM layers may create a reverse gradient, e.g. from high to low elasticity moduli value, relative to their respective distance from the MEMS transducer. In still other embodiments, the ESAM layers may be arranged relative to their respective distance from the MEMS transducer, in a manner of alternating elasticity moduli value, or even in a random arrangement.

In embodiments of MEMS device packages utilizing multiple ESAM layers, the modulus of elasticity of the most compliant ESAM layer(s) adjacent the MEMS transducer or ASIC or other device components may be in the range from 0.1 megapascal (MPa) to 10 MPa, but even more preferably in the range from 0.2 MPa to 5.0 MPa, but even still more preferably in the range from 0.4 MPa to 2.5 MPa.

In embodiments of MEMS device packages utilizing multiple ESAM layers, the modulus of elasticity of adjacent ESAM layers may differ. In one embodiment, the modulus of elasticity of adjacent ESAM layers may differ, with the relative ratio therebetween in the range from 2:1 to 3:1, but even more preferably in the range from 5:1 to 10:1, but even still more preferably in the range from 10:1 to 100:1. It is also contemplated, within the scope of this disclosure, that other arrangements of ESAM layers may be utilized for reducing the effects of both external and/or internal stimulus on the MEMS transducer.

The reader will appreciate that a MEMS device package implemented as described herein will result in a MEMS transducer 25 which is less susceptible to strain forces due to differences in coefficients of thermal expansion external and internal stimulus occurring within the surrounding environment.

Note, that within the contemplated embodiments, there is no limit to the number of ESAM layers that may be utilized, or to their respective dimensions. In addition, any of the elements described herein may be implemented in any combination, other than those illustrated without departing from the spirit and scope of the disclosure.

In another embodiment, any of the ESAM layers disclosed herein may be replaced with an open cell foam, particularly an exterior layer where acoustic isolation is important. Also, further mechanisms such as a rigid be applied to any of the MEMS device packages to further isolate the device. Conversely, a soft pad, such as rubber or other elastomer may be disposed adjacent any of the ESAM layers and a rigid surface, such as a PC board, to reduce the effects of any mechanical coupling therebetween.

In the disclosed embodiments, wirebonds 21 as well as those interconnecting a MEMS transducer 25 and ASIC 24 or any other components housed within the MEMS package may be implemented with gold filaments thread which is adequate for ensuring the appropriate electrical connection there between but is also relatively malleable and capable of flexing or withstanding motion with any of the one or more ESAM layers through which extends. Note other suitable electrically conductive thin film and elements may be similarly utilized.

It will be obvious to those recently skilled in the art that modifications to the apparatus and process disclosed here in may occur, including substitution of various component values or nodes of connection, without parting from the true spirit and scope of the disclosure.

What is claimed is:

1. A microelectromechanical (MEMS) apparatus comprising:
   a MEMS transducer having plurality of exterior surfaces; and
   a compliant isolation mechanism surrounding the plurality of exterior surfaces; a housing substrate defining an aperture into which the MEMS transducer is at least partially disposed, and where the compliant isolation mechanism separates the MEMS transducer from the housing substrate
   wherein the compliant isolation mechanism comprises plural layers of elastomeric-strain-absorbing-material surrounding some of the plurality of exterior surfaces of the MEMS transducer;
   wherein the plural layers of elastomeric-strain-absorbing-material comprises a first ESAM layer at least partially disposed adjacent the MEMS transducer and a second ESAM layer at least partially disposed adjacent first ESAM layer,
   wherein the first ESAM layer has an elasticity modulus value lower than an elasticity modulus value of the second ESAM layer.

2. The MEMS apparatus of claim 1 wherein the plural layers of elastomeric-strain-absorbing-material further comprise a third ESAM layer at least partially disposed adjacent the second ESAM layer.

3. The MEMS apparatus of claim 2 wherein the second ESAM layer has an elasticity modulus value lower than an elasticity modulus value of the third ESAM layer.

4. The MEMS apparatus of claim 1, wherein at least one of the plural ESAM layers has a plurality of air pockets disposed therein.

5. The MEMS apparatus of claim 1 wherein the air pockets are columnar in shape.

6. The MEMS apparatus of claim 1 wherein the ESAM layer has at least one reciprocating mass disposed therein.

7. A microelectromechanical (MEMS) package apparatus comprising:
   a MEMS transducer having plurality of exterior surfaces and defining one or more electrical contact areas;
   a plurality of electrical conductors connected to the electrical contact areas; and
   an isolation mechanism surrounding the plurality of exterior surfaces and at least partially surrounding the plurality of electrical conductors;
   wherein the isolation mechanism comprises plural layers of elastomeric-strain absorbing-material and wherein at least one of the plural ESAM layers has a plurality of air pockets disposed therein.

8. The MEMS apparatus of claim 7 wherein the air pockets are columnar in shape.

9. A microelectromechanical (MEMS) package apparatus comprising:
   a MEMS transducer having a plurality of exterior surfaces;
   a plurality of layers of an elastomeric-strain-absorbing material (ESAM) surrounding some of the plurality of exterior surfaces of the MEMS transducer,
   wherein the plurality of ESAM layers comprises:
      a first ESAM layer at least partially disposed adjacent the MEMS transducer;
      a second ESAM layer at least partially disposed adjacent the first ESAM layer; and
      a third ESAM layer at least partially disposed adjacent the second ESAM layer;
   wherein each of the plurality of ESAM layers possesses a different elastic modulus and wherein the plurality of ESAM layers is arranged in progressive order of their respective elastic modulii values, one of low to high modulus or high to low modulus.

10. The MEMS apparatus of claim 9, wherein the third ESAM layer possesses the lowest elastic modulus, the first ESAM layer possesses the highest elastic modulus, and the second ESAM layer possesses an elastic modulus between the elastic modulus of the first and third ESAM layers.

11. The MEMS apparatus of claim 9, wherein the third ESAM layer possesses the highest elastic modulus, the first ESAM layer possesses the lowest elastic modulus, and the second ESAM layer possesses an elastic modulus between the elastic modulus of the first and third ESAM layers.

* * * * *